(12) United States Patent
Lilak et al.

(10) Patent No.: US 10,978,590 B2
(45) Date of Patent: Apr. 13, 2021

(54) METHODS AND APPARATUS TO REMOVE EPITAXIAL DEFECTS IN SEMICONDUCTORS

(71) Applicant: Intel Corporation, Santa Clara, CA (US)

(72) Inventors: Aaron D. Lilak, Beaverton, OR (US); Rishabh Mehandru, Beaverton, OR (US); Patrick Morrow, Portland, OR (US); Patrick H. Keys, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 16/327,728

(22) PCT Filed: Sep. 30, 2016

(86) PCT No.: PCT/US2016/054846
§ 371 (c)(1),
(2) Date: Feb. 22, 2019

(87) PCT Pub. No.: WO2018/063346
PCT Pub. Date: Apr. 5, 2018

(65) Prior Publication Data
US 2019/0189795 A1 Jun. 20, 2019

(51) Int. Cl.
*H01L 29/78* (2006.01)
*H01L 21/02* (2006.01)
(Continued)

(52) U.S. Cl.
CPC ............ *H01L 29/785* (2013.01); *H01L 21/02* (2013.01); *H01L 21/302* (2013.01);
(Continued)

(58) Field of Classification Search
CPC ....... H01L 29/785; H01L 29/66; H01L 21/02; H01L 21/302; H01L 21/768;
(Continued)

(56) References Cited

U.S. PATENT DOCUMENTS 8,617,996 B1   12/2013  Chi et al.
9,368,604 B1 *  6/2016  Dal .................. H01L 29/66795
(Continued)

OTHER PUBLICATIONS

Patent Cooperation Treaty, "International Search Report," issued in connection with International Application No. PCT/US2016/054846, dated Jun. 28, 2017, 5 pages.
(Continued)

*Primary Examiner* — Kyoung Lee
(74) *Attorney, Agent, or Firm* — Green, Howard & Mughal LLP

(57) ABSTRACT

Methods and apparatus to remove epitaxial defects in semiconductors are disclosed. A disclosed example multilayered die structure includes a fin having a first material, where the fin is epitaxially grown from a first substrate layer having a second material, and where a defect portion of the fin is etched or polished. The disclosed example multilayered die structure also includes a second substrate layer having an opening through which the fin extends.

19 Claims, 13 Drawing Sheets

(51) Int. Cl.
*H01L 21/78* (2006.01)
*H01L 29/66* (2006.01)
*H01L 21/762* (2006.01)
*H01L 21/302* (2006.01)
*H01L 21/768* (2006.01)
*H01L 21/304* (2006.01)

(52) U.S. Cl.
CPC .......... *H01L 21/304* (2013.01); *H01L 21/762* (2013.01); *H01L 21/768* (2013.01); *H01L 21/76802* (2013.01); *H01L 21/78* (2013.01); *H01L 29/66* (2013.01); *H01L 29/66795* (2013.01)

(58) Field of Classification Search
CPC . H01L 21/304; H01L 21/76802; H01L 21/78; H01L 29/66795; H01L 21/762
See application file for complete search history.

(56) References Cited

U.S. PATENT DOCUMENTS

| | | | |
|---|---|---|---|
| 2012/0104472 A1* | 5/2012 | Xu | H01L 27/0886 257/288 |
| 2013/0271175 A1 | 10/2013 | Powell | |
| 2014/0342536 A1 | 11/2014 | Bai et al. | |
| 2016/0064492 A1 | 3/2016 | Li et al. | |
| 2016/0087062 A1* | 3/2016 | Yin | H01L 29/66795 257/344 |

OTHER PUBLICATIONS

Patent Cooperation Treaty, "Written Opinion of the International Searching Authority," issued in connection with International Application No. PCT/US2016/054846, dated Jun. 28, 2017, 8 pages.

\* cited by examiner

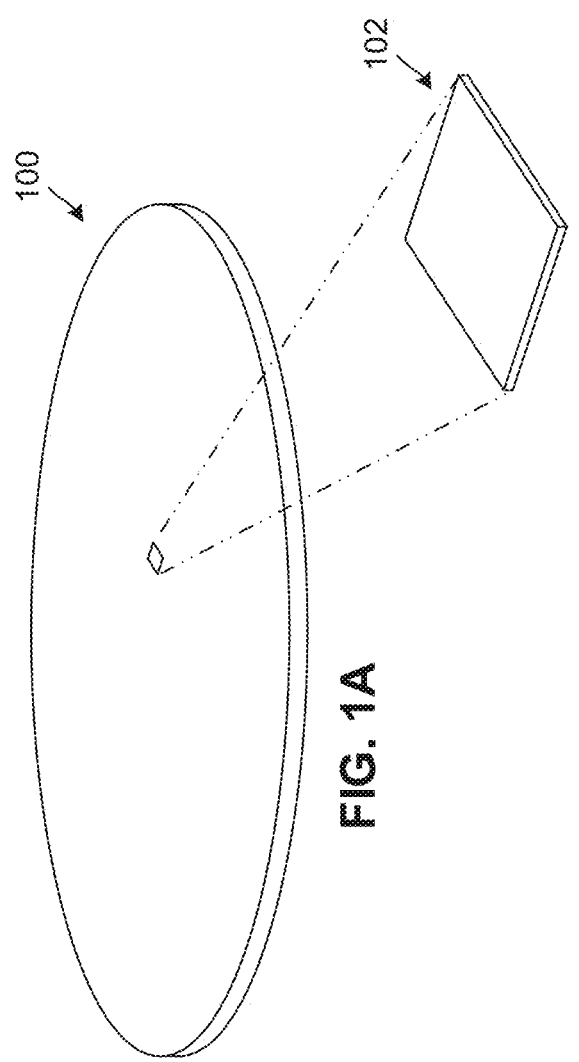

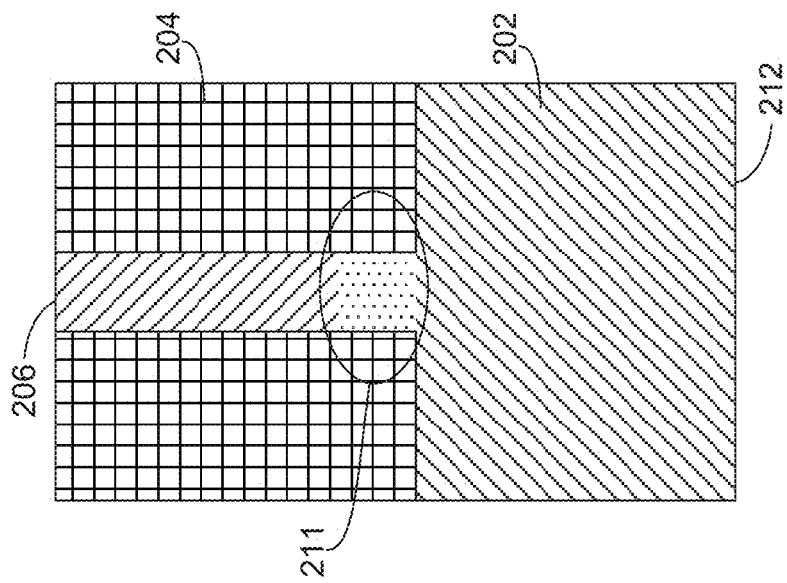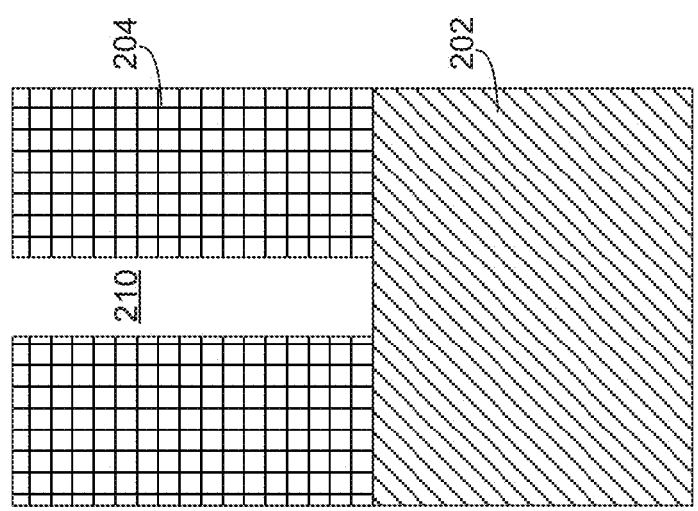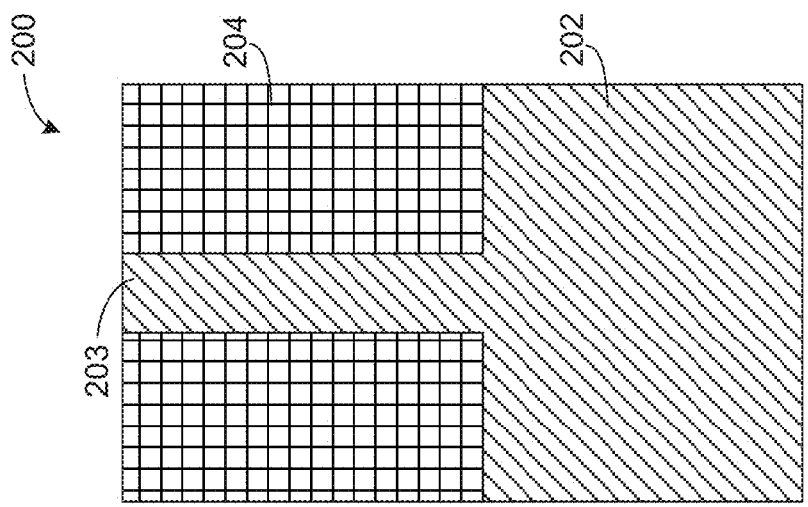

METHODS AND APPARATUS TO REMOVE EPITAXIAL DEFECTS IN SEMICONDUCTORS

FIELD OF THE DISCLOSURE

This disclosure relates generally to semiconductor fabrication, and, more particularly, to methods and apparatus to remove epitaxial defects in semiconductors.

BACKGROUND

In recent years, semiconductor devices such as microprocessors (e.g., processors) have become smaller and more compact while their die transistor counts have increased dramatically due to increasing computational needs (e.g., transistor counts in the billions). To increase compactness and/or functionality, some semiconductor structures may incorporate semiconductor regions formed of epitaxially-deposited materials (e.g., a semiconductor layer deposited and/or grown), which can differ in composition from a semiconductor substrate that is applied with the epitaxially-deposited materials. In turn, this difference in composition can lead to defects resulting from mismatched molecular lattices at an interface between the semiconductor substrate and the epitaxially-deposited materials.

In a particular example, a defect region/portion resulting from mismatched molecular lattices (e.g., a material mismatch) may exist where a fin structure having a first material extends from a semiconductor substrate having a second material. In such examples, the fin structure may be epitaxially grown from the base semiconductor structure (e.g., deposited atoms onto the base structure) such that molecular lattice structures of the first material are mismatched with the second material. The resultant defect region of the fin and/or the substrate can cause loss of strength and/or functionality and enable deleterious electrical leakage current (e.g., electrical functionality).

In some examples, defect regions are simply left within semiconductor devices. However, these defect regions may manifest as early component failures caught during screening, thereby reducing device yields, or latent defects, which may cause reliability issues during operation. Further, the aforementioned defect regions may result in leakage current and/or necessitate the use of higher power for operation of functioning devices.

BRIEF DESCRIPTION OF THE DRAWINGS

FIG. 1A illustrates an example wafer in which the examples disclosed herein may be implemented.

FIG. 1B illustrates an example die that may be cut from the wafer of FIG. 1A.

FIGS. 2A-2D are detailed cross-sectional views of an example layered structure of the example wafer of FIG. 1A, in which the examples disclosed herein may be implemented.

Figure 2D:
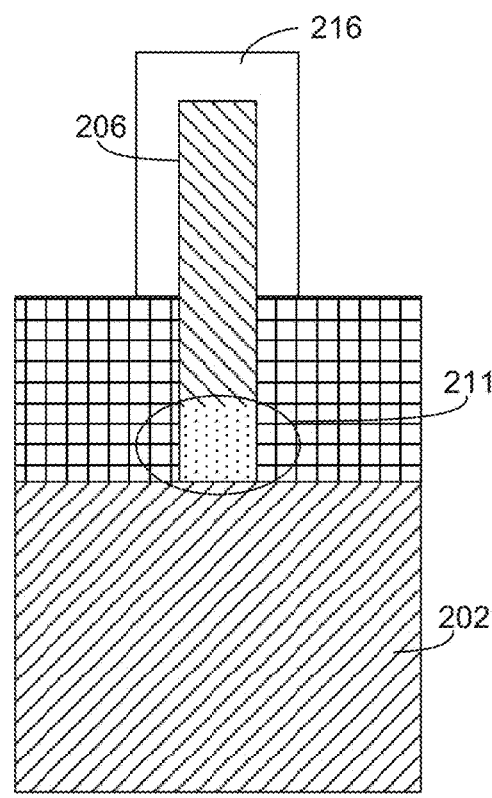

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Methods and apparatus to remove semiconductor epitaxial defects are disclosed. As a result of integrating different substrate materials in semiconductor fabrication, for example, defects due to mismatched molecular lattices of the materials can manifest. In particular, a semiconductor layer may be deposited and/or grown onto a base semiconductor substrate. For example, a defect region may exist where a fin structure of a first material extends from a semiconductor substrate of a second material. In such examples, the fin structure may be epitaxially grown from the base semiconductor structure such that molecular lattice structures of the first material are mismatched with those of the second material. These mismatched molecular structures can, thus, define a defect region which, in turn, can result in a potential loss of strength and/or functionality.

In some known examples, defect regions are simply left within (e.g., left embedded within) semiconductor devices. For example, a defect region may be embedded within a manufactured layered die structure cut from a wafer. However, these defect regions may manifest as immediate component failures or latent defects. Further, the defect regions may result in leakage current and can prevent integration of different semiconductor materials such as Silicon along with Silicon-Germanium. Even further, the defect regions may result in higher power consumption/needs for their respective devices.

The examples disclosed herein remove and/or reduce these defect regions that result from integration/application of different semiconductor materials, which can result in molecular lattice misalignment of interfacing atoms (e.g., misalignment caused by epitaxial growth/deposition). As a result, the examples disclosed herein enable reduction of potential leakage current and also enable use of material and/or material systems that are typically difficult to integrate with Silicon, such as Silicon-Germanium (SiGe), Germanium, Germanium Tin, Indium Gallium Arsenide (InGaAs) and/or Group III-V compound semiconductors, etc. The examples disclosed herein also enable a reduction in power consumption of semiconductor devices.

To remove defect regions (e.g., areas and/or volumes of molecular misalignment from epitaxial growth), the examples disclosed utilize a removal process to expose a portion of a substrate fin, which is epitaxially grown from a substrate of a different material, and selectively etch and/or polish a portion of the substrate fin that has a defect region. In some examples, the substrate and/or the fin are annealed after the portion is etched. Additionally or alternatively, in some examples, an opening defined by the etching process is back filled (e.g., back filled with a lattice compatible or compliant gap filler material such as a flowable oxide or other similar material). The examples disclosed herein also enable angled contours and/or fin shapes such as trapezoids and/or inclined surfaces. The examples disclosed herein also enable integration of wiring and/or devices within fin structures and/or fin shapes.

FIG. 1A illustrates an example wafer 100 in which the examples disclosed herein may be implemented. The wafer 100 of the illustrated example consists of multiple semiconductor dies. In this example, the individual semiconductor dies are functionally tested prior to being separated (e.g., cut) from the wafer 100. In particular, test patterns are provided to each individual die and each individual die is monitored to have a designated response. In some examples, faulty dies discovered during this testing are discarded.

FIG. 1B illustrates an example die (e.g., a microprocessor die) 102 that may be cut from the wafer 100 of FIG. 1A. In this example, the die 102 is cut from the wafer 100 and separated (e.g., cut and/or sliced) from the wafer 100 after being successfully tested with the aforementioned functionality test described above. The die 102 of the illustrated example may be used for a microprocessor or any other semiconductor device, for example.

FIGS. 2A-2D are detailed cross-sectional views of an example layered structure 200 of the example wafer 100 of FIG. 1A, in which the examples disclosed herein may be implemented. The example of FIGS. 2A-2D represents a typical process that can result in an epitaxial regrowth/damage portion that, in turn, can result in leakage current, which potentially reduces performance (e.g., computational performance) of a corresponding semiconductor device. Turning to FIG. 2A, a substrate (e.g., an interlayer dielectric) 202, which is Silicon in this example, is shown having a fin 203 extending into another substrate (e.g., a trench gap fill) 204. In particular, the fin 203 of the illustrated example represents a single fin of a fin pattern of the substrate 202.

FIG. 2B depicts the layered structure 200 after the fin 203 has been etched. In this example, the etching process has defined a cavity 210 in the substrate 204 that extends to the substrate 202. According to the illustrated example, the cavity 210 is formed by selectively etching the fin 203 shown in FIG. 2A. Additionally or alternatively, the fin 203 is etched via a timed etching process that controls a penetration depth and/or penetration area.

Turning to FIG. 2C, an epitaxial regrowth process is shown. In particular, a fin 206 is epitaxially grown in the cavity 210 shown in FIG. 2B. The fin 206 of the illustrated example is defined by depositing applying atoms/material into the cavity 210. However, the fin 206 is composed of a different material (e.g., Germanium) than the substrate 202. As a result of this material mismatch (e.g., a difference in molecular structures/arrangement), a defect region (e.g., a defect portion, a defect volume, a defect area, etc.) 211 is present at or proximate an interface between the substrate 202 and the fin 206. This defect region 211 defines a portion/volume in which interfacing molecular structures of different materials have lattice mismatches. Thus, the defect region 211 may result in component defects (e.g., leakage currents, etc.) and/or lack of internal structural integrity of interconnections and/or components. The extent of the effect(s) of the defect region 211 may be dependent on the degree of molecular lattice misalignment between a first material of the substrate 202 and a second material of the fin 206. In this example, a side 212 is designated as a back side of the wafer 100.

FIG. 2D illustrates further processing of the layered structure 200. As can be seen in the illustrated view of FIG. 2D, a gate (e.g., a semiconductor gate) 216 has been defined on, over and/or surrounding the fin 206. As a result of this further processing (e.g., front side processing), the defect region 211 is still present at an interface of the fin 206 and the substrate 202. As explained above, this defect region 211 may impair and/or negatively affect operation of this semiconductor device.

Figure 2E:
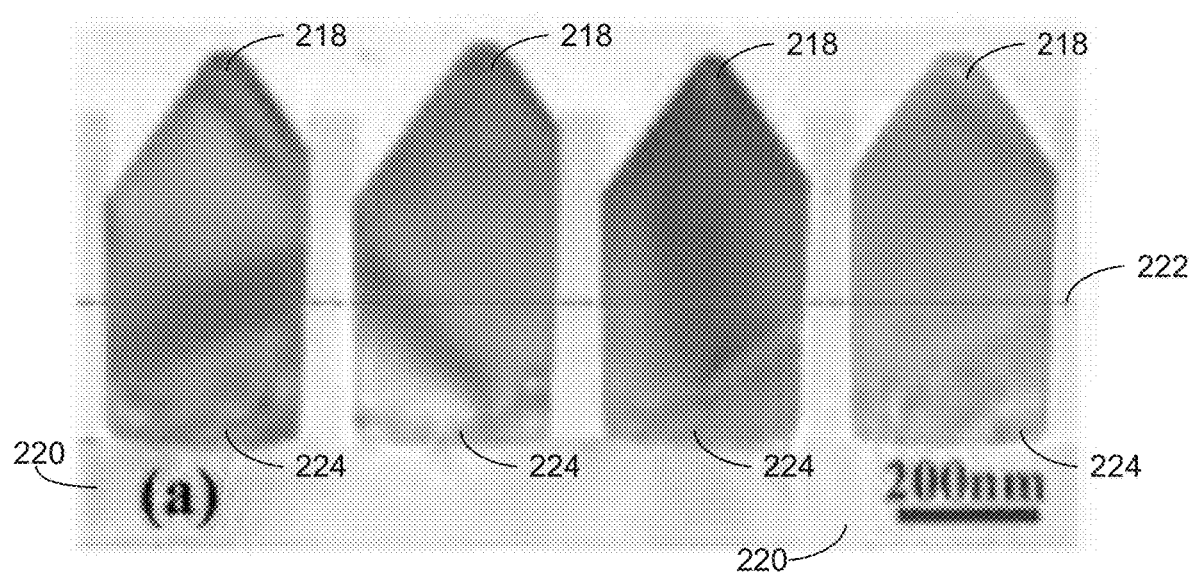
FIG. 2E shows photographs of cross-sections that indicate epitaxial growth/deposition mismatch of a semiconductor device.

FIG. 2E shows photographs of cross-sections of a semiconductor device that indicate epitaxial growth/deposition mismatch. As can be seen in the illustrated example, epitaxially grown fins 218 extend from a substrate 220. Additionally, below a line 222, defect regions 224 corresponding to each of the fins 218 are shown.

Figure 3C:
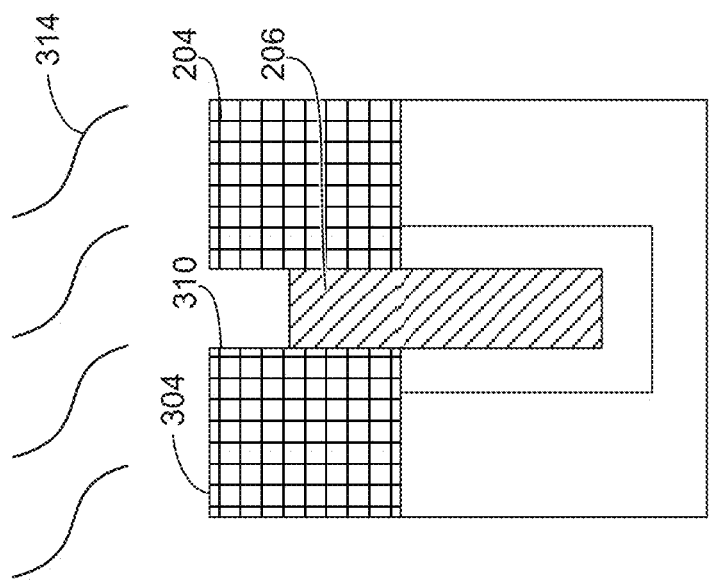
FIGS. 3A-3C are cross-sectional views of the example layered structure shown in FIGS. 2A-2D, illustrating an example method in accordance with the teachings of this disclosure.
Figure 3B:
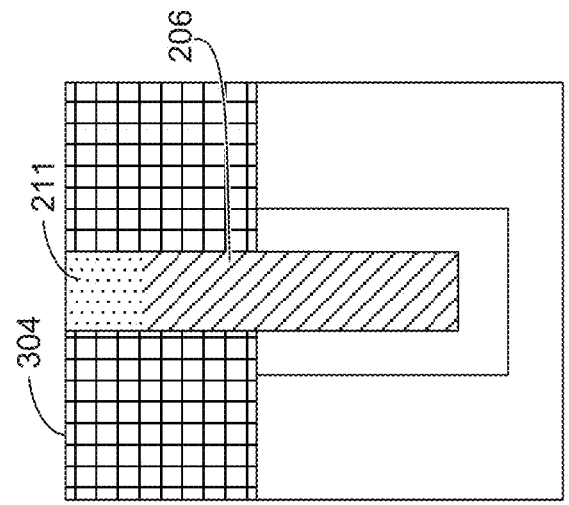
Figure 3A:
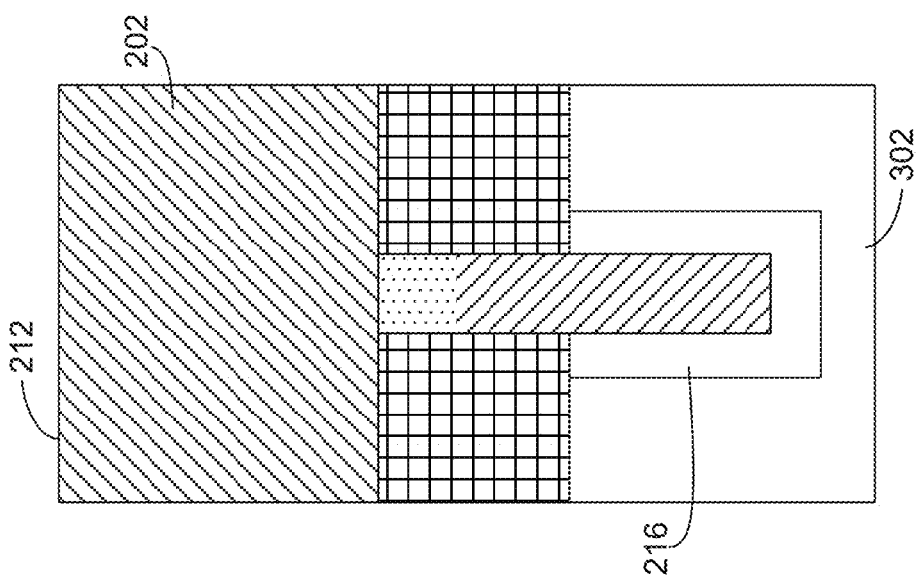

FIGS. 3A-3C are cross-sectional views of the example layered structure 200 shown in FIGS. 2A-2D, illustrating an example method in accordance with the teachings of this disclosure. Turning to FIG. 3A, the layered structure 200 is shown inverted (e.g., upside down) from the views shown in FIGS. 2A-2D to illustrate processing on the back side 212 of the substrate 202. According to the illustrated example, the gate 216 described above has been applied with a substrate 302.

Turning to FIG. 3B, a portion of the substrate 202 is removed to define an exposed surface 304 of the substrate 206. In particular, the substrate 202 has been etched to expose the defect region 211 of the fin 206. The etching process may be mechanical, chemical and/or photochemical. While an etching process is described in this example, additionally or alternatively, a polishing process may be used to expose the defect region 211. Alternatively, a polishing and/or etching process may be used to define an opening (e.g., an annular opening) and/or cavity in/on the substrate 202 that is proximate the defect region 211 so that the defect region 211 can be exposed for etching, for example.

FIG. 3C illustrates the layered structure 200 after the defect region 211 has been removed, thereby defining an opening 310. In this example, the opening 310 exposes a portion of the fin 206 that does not include a significant amount of defects (e.g., does not include any portion of the defect region 211). In some examples, the layered structure 200 is further processed such that the opening 310 is still present as a cavity (e.g., a pocket) after further layering and/or structures (e.g., interconnects, components) are added above the substrate 204 (in the view of FIG. 3C).

In some examples, an annealing process may be implemented in the examples disclosed herein. In some examples, after the defect region 211 has been etched (as described above in connection with FIG. 3C), an annealing process is applied. In such examples, heat, which is generally indicated by lines 314, is applied to the layered structure 200 in a low temperature annealing process, for example, and the layered structure 200 is later slowly cooled after being heated. According to the illustrated example, the annealing process is used to remove etch-related interfacial charge and/or defects (e.g., defects associated with the etching process).

In some other examples, the layered structure 200 is annealed in a high temperature process. Additionally or alternatively, a Hydrogen annealing process utilized. In particular, deuterium ($H_2$) may be applied at a high temperature (e.g., 450° C. (degrees Celsius)) and/or at a relatively high pressure (e.g., 12 atmosphere (atm)). While annealing conditions, temperatures and pressures are described above, any appropriate conditions and/or annealing techniques may be used that are appropriate to an application, thickness, desired component spacing and/or structure (e.g., a desired layered arrangement), etc.

Figure 5:
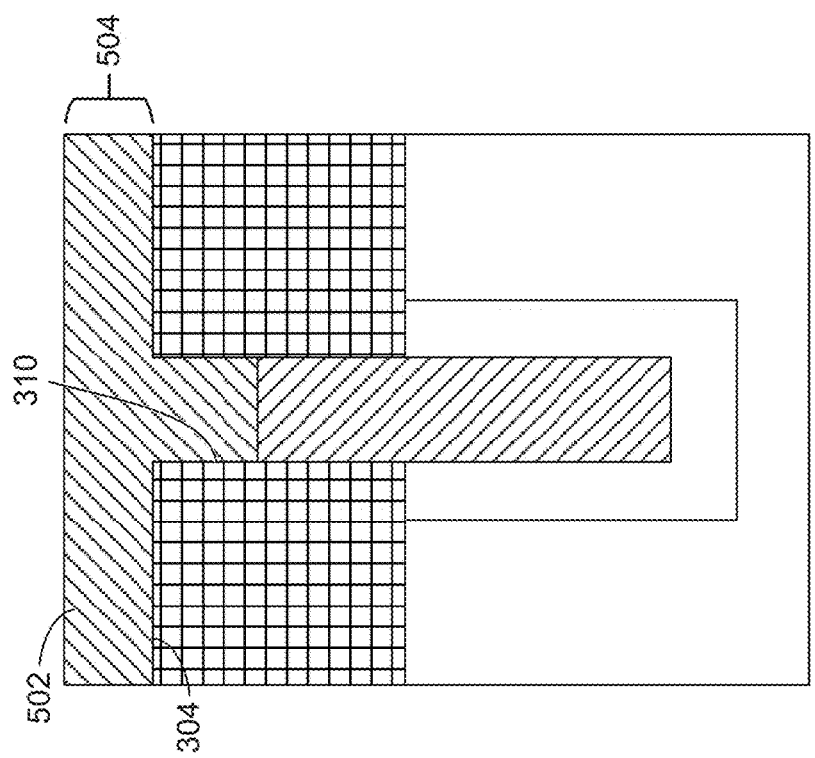
FIGS. 4 and 5 are cross-sectional views illustrating an example back filling process that may be implemented in the examples disclosed herein.
Figure 4:
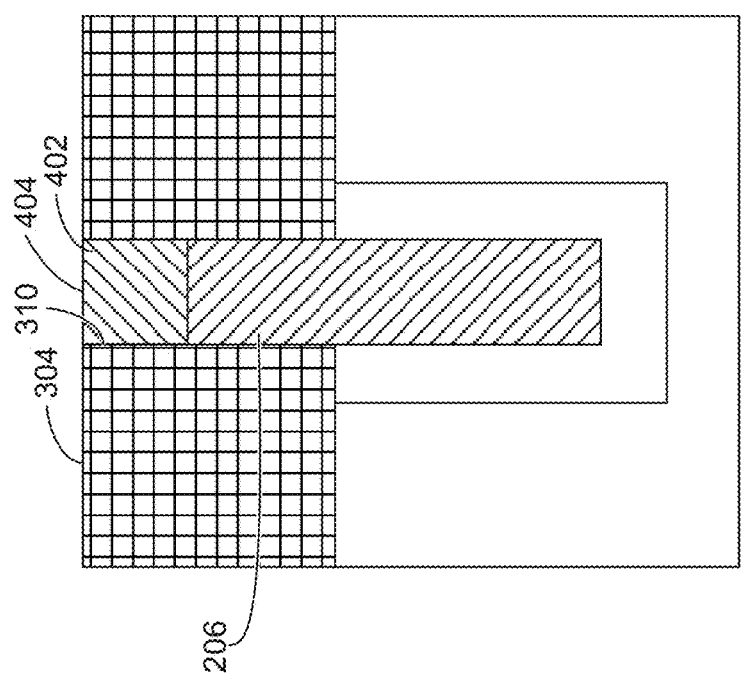

FIGS. 4 and 5 are cross-sectional views illustrating an example back filling process that may be implemented in the examples disclosed herein. In some examples, exposed portions of fins 206 are covered and/or back filled after an etching and/or polishing process. Turning to the illustrated example of FIG. 4, the opening 310 of the layered structure 200 is filled (e.g., back filled) with material to prevent a cavity and/or pocket from being formed above the fin 206. As a result, a back fill (e.g., a back fill material) 402 is deposited in the opening 310. In this example, an end 404 of the back fill 402 is in relatively close alignment with the exposed surface 304 of the substrate 206. However, in other examples, the end 404 may extend past the exposed surface 304 or be recessed below the exposed surface 304.

Turning to FIG. 5, an alternative exemplary application of back fill material to FIG. 4 is shown in FIG. 5. According to the illustrated example, a back fill 502 is applied to the layered structure 200 to fill the opening 310 as well as extend beyond the exposed surface 304 (in contrast to the example of FIG. 4), thereby defining a layer (e.g., a barrier, a protective layer, etc.) 504 of the layered structure 200.

The back fill 402 and/or the back fill 502 shown in FIGS. 4 and 5, respectively, may be an insulating dielectric (e.g., a non-conductive back filler material). Alternatively, the back fill 402 and/or the back fill 502 may include a conductive material and/or dielectric. In some examples, metallization may occur after application of the back fill material (e.g., above the back fill 502 in the view of FIG. 5).

Figure 6:
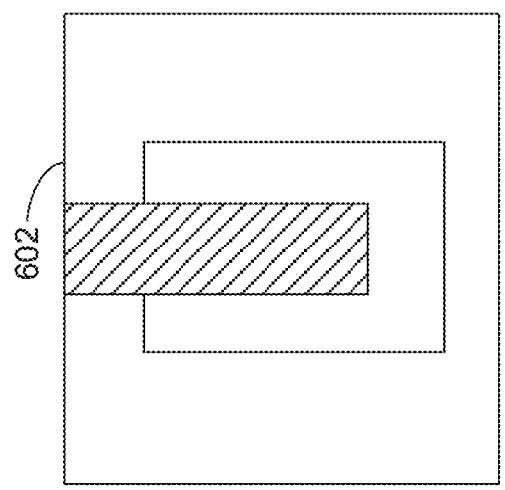
FIG. 6 is a cross-sectional view illustrating an example polishing process that may be implemented in the examples disclosed herein.

FIG. 6 is a cross-sectional view illustrating an example polishing process that may be implemented in the examples disclosed herein. In particular, this polishing process may be implemented after the step of FIG. 3B. Additionally or alternatively, the polishing process shown may be implemented in conjunction with any of the processes described above in connection with FIGS. 4 and 5, for example. As seen in the illustrated example, a polishing process (e.g., a mechanical polishing process) may be used to remove the defect region 211 and/or a portion of the defect region 211, thereby exposing a surface 602. In some examples, further layers may be added and/or metallization may be defined on the surface 602.

Figure 7:
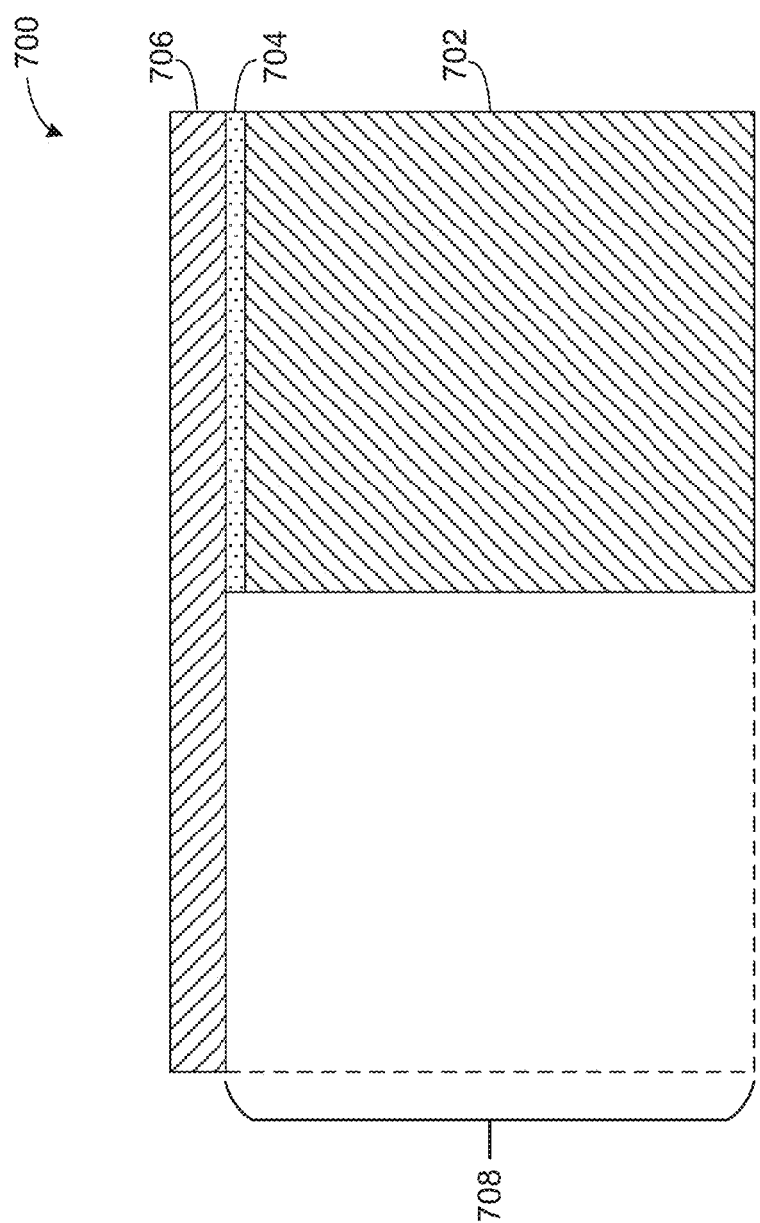
FIG. 7 is a cross-sectional view illustrating an example semiconductor layering process in accordance with the teachings of this disclosure.

FIG. 7 is a cross-sectional view illustrating an example semiconductor layering process in accordance with the teachings of this disclosure. In this example, a layered structure 700 is shown that includes a substrate 702, a defect region 704 and an applied/deposited substrate (e.g., a semiconductor substrate layer) 706 above the defect region 704. In this example, additional layers and/or metallization may be provided (e.g., deposited) above (as viewed in FIG. 7), within and/or on the example substrate 706. In this example, the substrate 702 along with at least a portion of the defect region 704 are then removed by an etching process and/or a polishing process, as indicated by a removed portion 708 of the layered structure 700. The example process of FIG. 7 may be applied across a partial section of a die. In other words, the portions of the substrate 702 along with portions of the defect region 704 may be removed by polishing and/or etching a pattern (e.g., defined by a resist layer).

Figure 8:
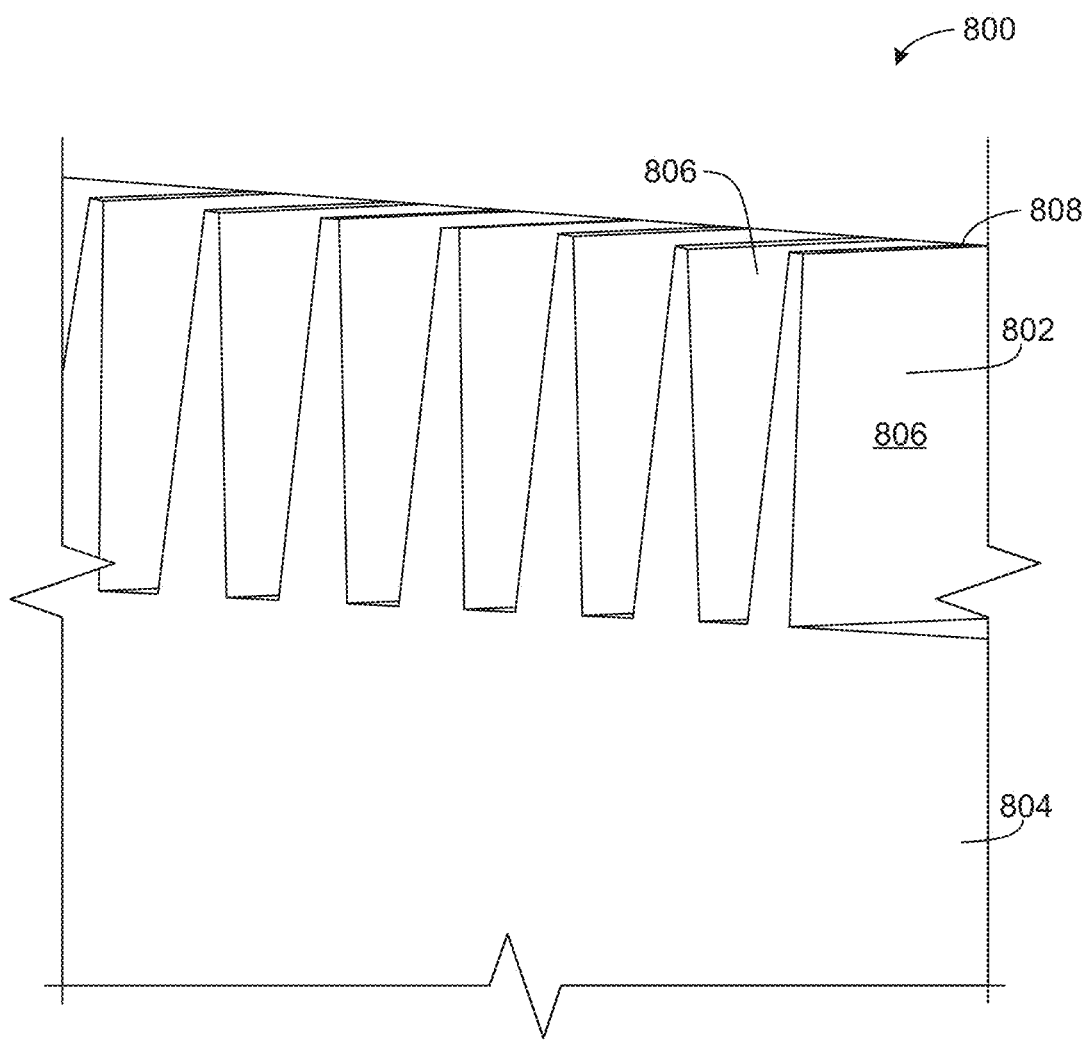
FIG. 8 depicts an example trapezoidal fin structure that may be defined using the examples disclosed herein.

FIG. 8 depicts an example trapezoidal fin structure 800 that may be defined using the examples disclosed herein to remove epitaxial defects. According to the illustrated example, the fin structure 800 includes trapezoidal fins 802 that extend from a substrate base 804, which may be a substrate layer similar to the substrate 204 or may be a back filled layer such as the back fill layer 504. In this example, each of the trapezoidal fins 802 include a ramped surface 806 as well as converging tip 808 that defines a relatively flat surface in this example.

Figure 9:
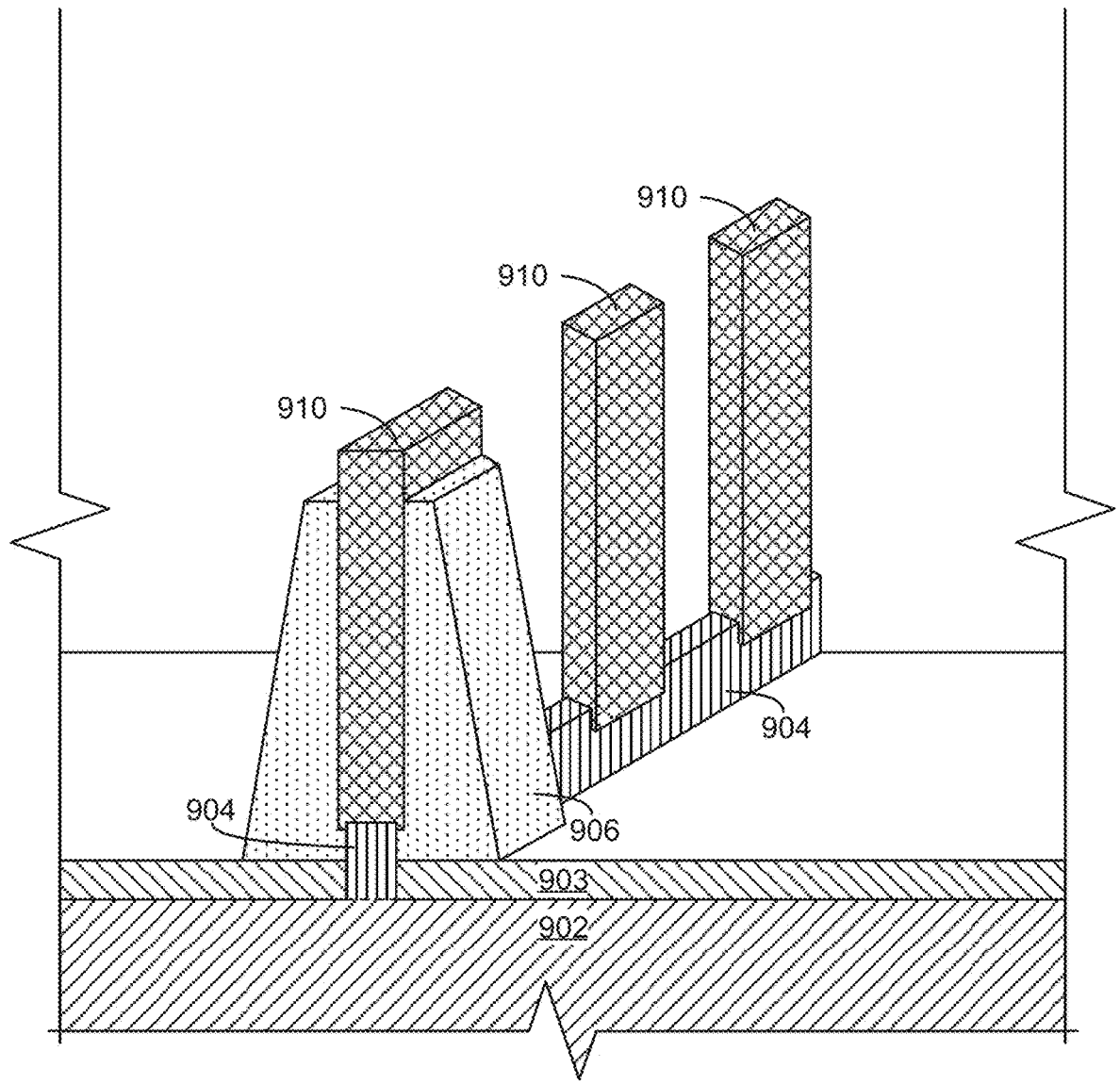
FIG. 9 depicts an example device structure that may be defined using the examples disclosed herein.

FIG. 9 depicts an example device structure 900 that may be defined using the examples disclosed herein. In this example, the device structure 900 includes a substrate base 902, a back fill material layer 903, a fin 904 that extends from the substrate base 902, as well as a device (e.g., a transistor, a gate, a diode, etc.) 906. The fin 904 of the illustrated example also includes interconnects (e.g., metallized interconnects, wires) 910 that are electrically isolated from one another and extend from and/or through different portions of the fin 904 along an upward direction (as viewed in FIG. 9).

In some examples, the fin 904 has a trapezoidal shape and/or inclined/ramped surfaces. However, in other examples, any appropriate geometry and/or shape may be defined.

Figure 10:
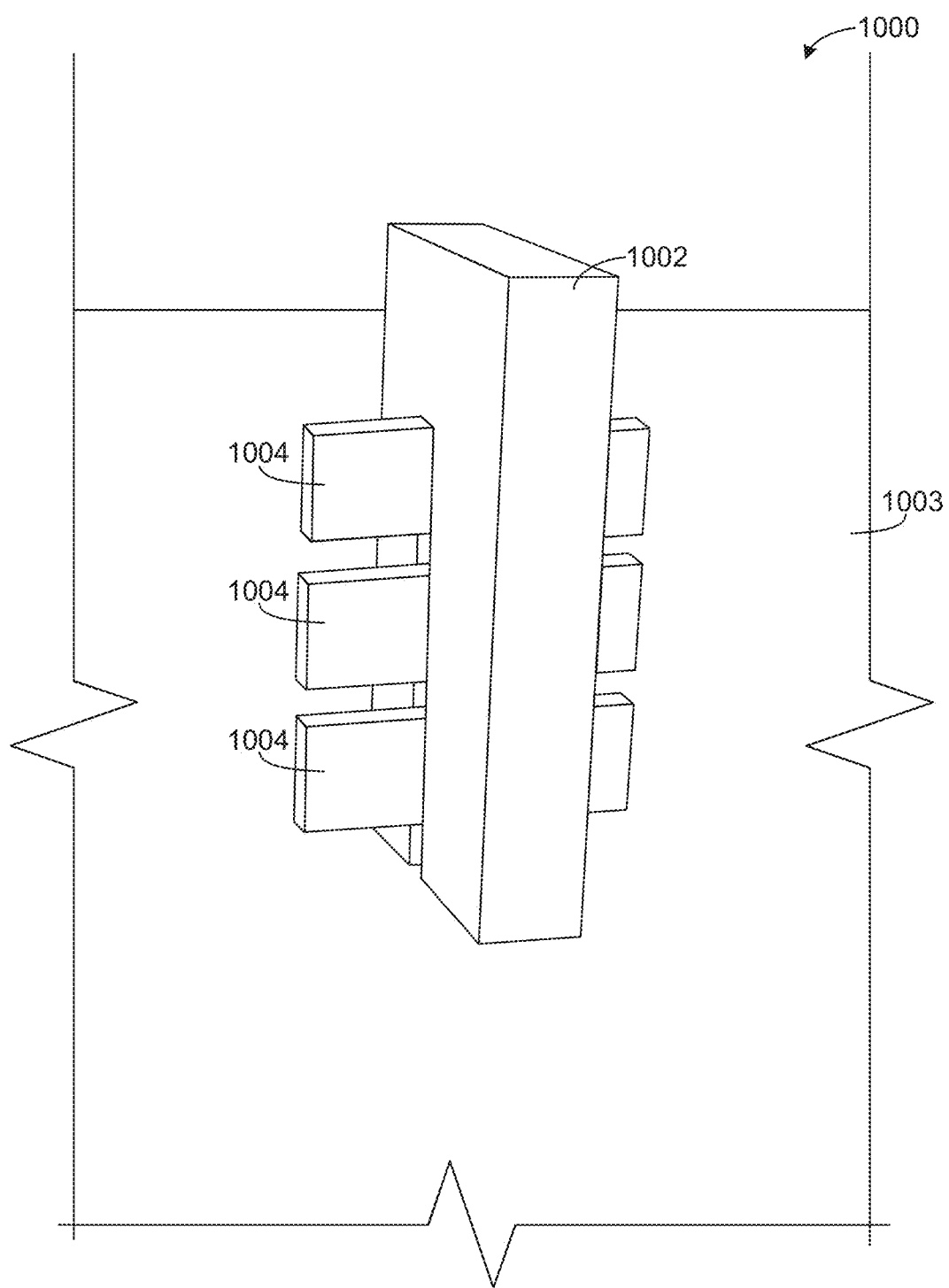
FIG. 10 depicts yet another example device structure that may be defined using the examples disclosed herein.

FIG. 10 depicts yet another example device structure 1000 that may be defined using the examples disclosed herein. According to the illustrated example, the device structure 1000 includes a fin 1002 extending from a substrate 1003 as well as transverse wires 1004 extending therethrough. The transverse wires (e.g., nanowires) 1004 of the illustrated example may be used to electrically couple one or more components (e.g., transistors, diodes, etc.) of a semiconductor wafer and/or die. While the example structures disclosed herein include fins, trapezoidal components, device structures, support structures and/or wire structures, the examples disclosed herein may be used to define any other appropriate semiconductor structure.

Figure 11:
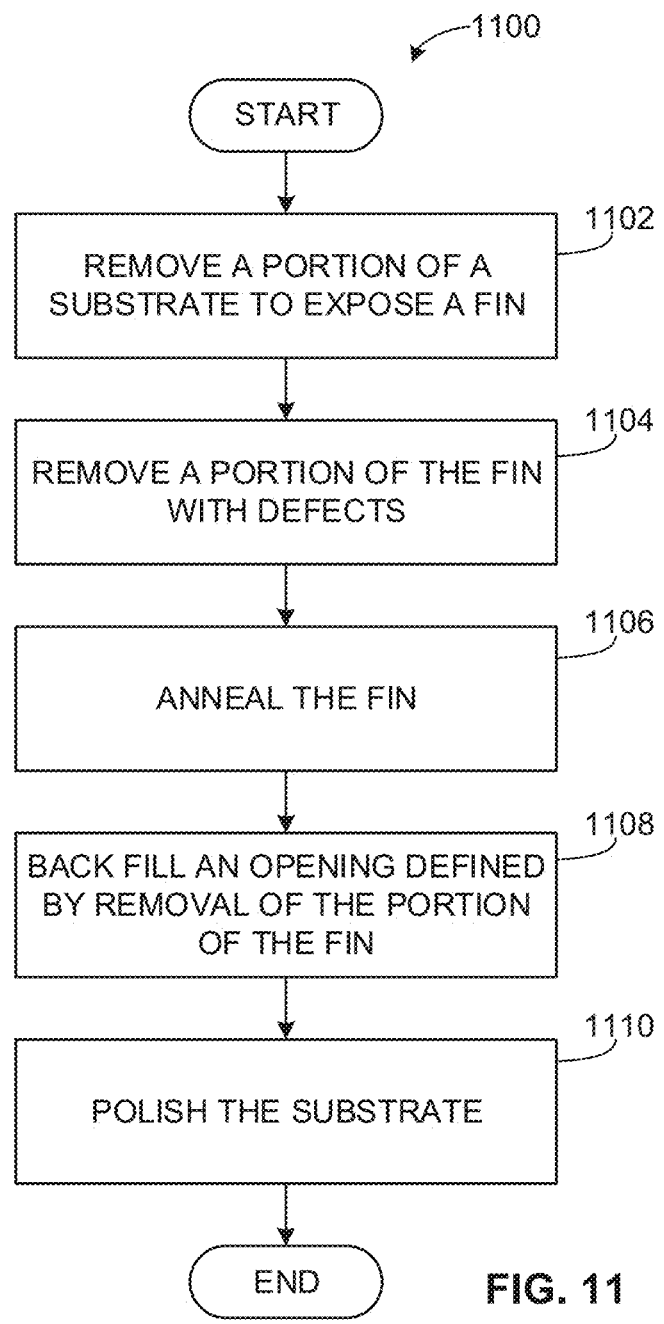
FIG. 11 is flowchart representative of an example method that may be used to implement the examples disclosed herein.

FIG. 11 is flowchart representative of an example method 1100 that may be used to implement the examples disclosed herein. In this example, a fin (e.g., the fin 206) is to be processed to remove a defect portion/region (e.g., the defect portion 211). In this example, the fin has been epitaxially grown from a substrate and has a different material from the substrate.

A portion of a substrate (e.g., the substrate 202, the substrate 702) is removed to expose the fin (e.g., the fin 206) (block 1102). The portion may be removed via an etching and/or polishing process, for example. In examples where the portion of the substrate is etched, the etching process may be mechanical, chemical and/or photochemical.

A portion of the fin containing defects (e.g., the defect region 211, the defect region 704) is removed (block 1104). For example, an etch process that only selectively etches the material of the fin and/or more effectively etches the material of the fin (as opposed to the substrate) is used. Additionally or alternatively, in some examples, an etching solution that etches the fin at a higher rate than substrate may be used.

In some examples, the fin is annealed (block 1106). In this example, the fin along with the overall die and/or wafer structure is high temperature annealed at a temperature exceeding 450° C. In other examples, the die and/or wafer structure is low temperature annealed.

In some examples, an opening resulting from removing the defect portion of the fin (e.g., a cavity defined by etching the fin) is back filled (block 1108). In some examples, a non-conductive dielectric material is applied to back fill the fin. In some examples, the fin is back filled to be relatively flush and/or aligned with a substrate surface (e.g., a back side of a substrate surface). Additionally or alternatively, the back fill material is polished and/or etched.

In some examples, the substrate and/or a portion of the fin with defects is polished (block 1110) and the process ends. In particular, the portion of the fin and/or the substrate may be removed together in such a polishing process. In some examples, a polishing process is used in lieu of an etching and/or selective etching process described above.

Figure 12:
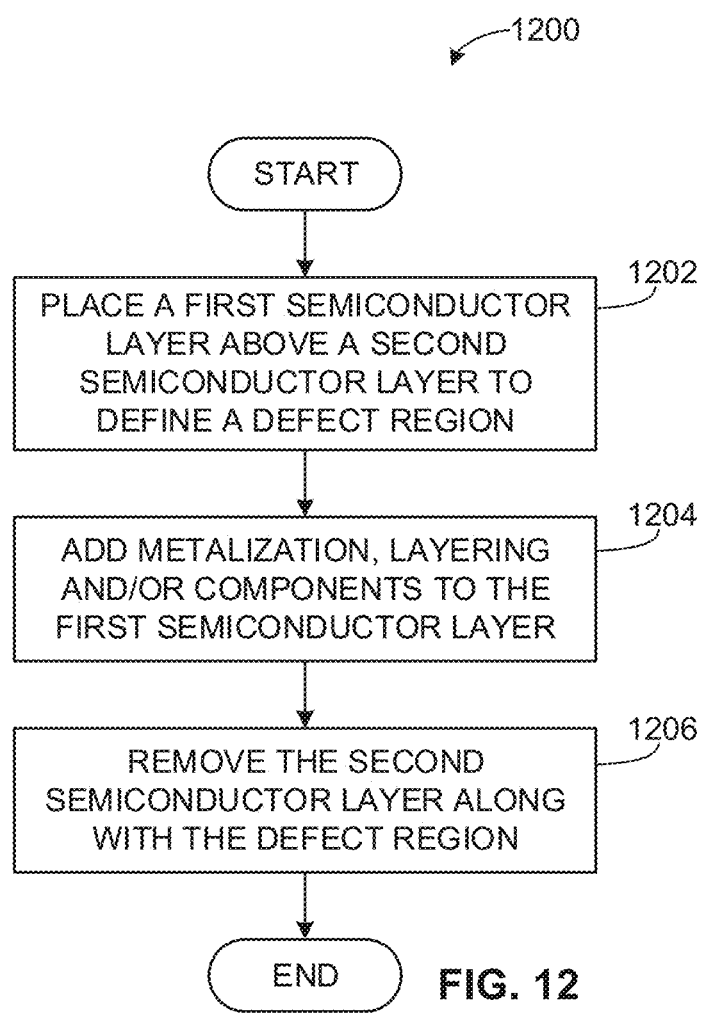
FIG. 12 is flowchart representative of another example method that may be used to implement the examples disclosed herein.

FIG. 12 is flowchart representative of another example method 1200 that may be used to implement the examples disclosed herein. In this example, a defect portion of a layered structure of a wafer and/or die is to be removed to prevent potential leakage current issue(s). In this example, a defect portion is to be defined from dissimilar semiconductor materials being applied, layered and/or coupled together (e.g., by defining stacked multiple layers of dissimilar materials).

According to the illustrated example, a first semiconductor layer (e.g., the substrate 706) is placed onto a second semiconductor layer (e.g., the substrate 702), thereby defining a defect region (e.g., the defect region 704) defined between the first and second semiconductor layers (block 1202). In particular, the lattice mismatch between the first and second semiconductor layers has caused the defect region to be defined.

In this example, the defect region is fully covered by the first semiconductor layer. In other words, in this example, the first semiconductor layer is not patterned onto the second semiconductor layer, but instead applied as a layer (e.g., a covering layer). In other examples, the first semiconductor layer may be applied as a pattern (e.g., during a lithography process), thereby also defining a pattern of the defect region at an interface between the first and second semiconductor layers.

Next, metallization, additional layering and/or components are added (block 1204). In particular, the components such as transistors along with corresponding interconnects (e.g., metallic interconnects) may be defined/added within and/or on the added first semiconductor layer.

The second semiconductor layer along with the defect region are removed (e.g., etched and/or polished) (block 1206) and the process ends. For example, a wafer on which a die is arranged in may be coupled to a carrier/fixture so that the second semiconductor layer along with the defect region may be removed.

As described above, flowcharts representative of example methods for implementing the examples disclosed herein are shown in FIGS. 11 and 12. The example methods may be implemented by machine readable instructions that comprise a program(s) for execution by a processor such as the processor 1312 shown in the example processor platform 1300 discussed below in connection with FIG. 13. The program, which may be implemented by semiconductor fabrication equipment, may be embodied in software stored on a tangible computer readable storage medium such as a CD-ROM, a floppy disk, a hard drive, a digital versatile disk (DVD), a Blu-ray disk, or a memory associated with the processor 1312, but the entire program and/or parts thereof could alternatively be executed by a device other than the processor 1312 and/or embodied in firmware or dedicated hardware. Further, although the example program is described with reference to the flowcharts illustrated in FIGS. 11 and 12, many other methods of implementing the examples disclosed herein may alternatively be used. For example, the order of execution of the blocks may be changed, and/or some of the blocks described may be changed, eliminated, or combined.

As mentioned above, the example methods of FIGS. 11 and 12 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example methods of FIGS. 11 and 12 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 13:
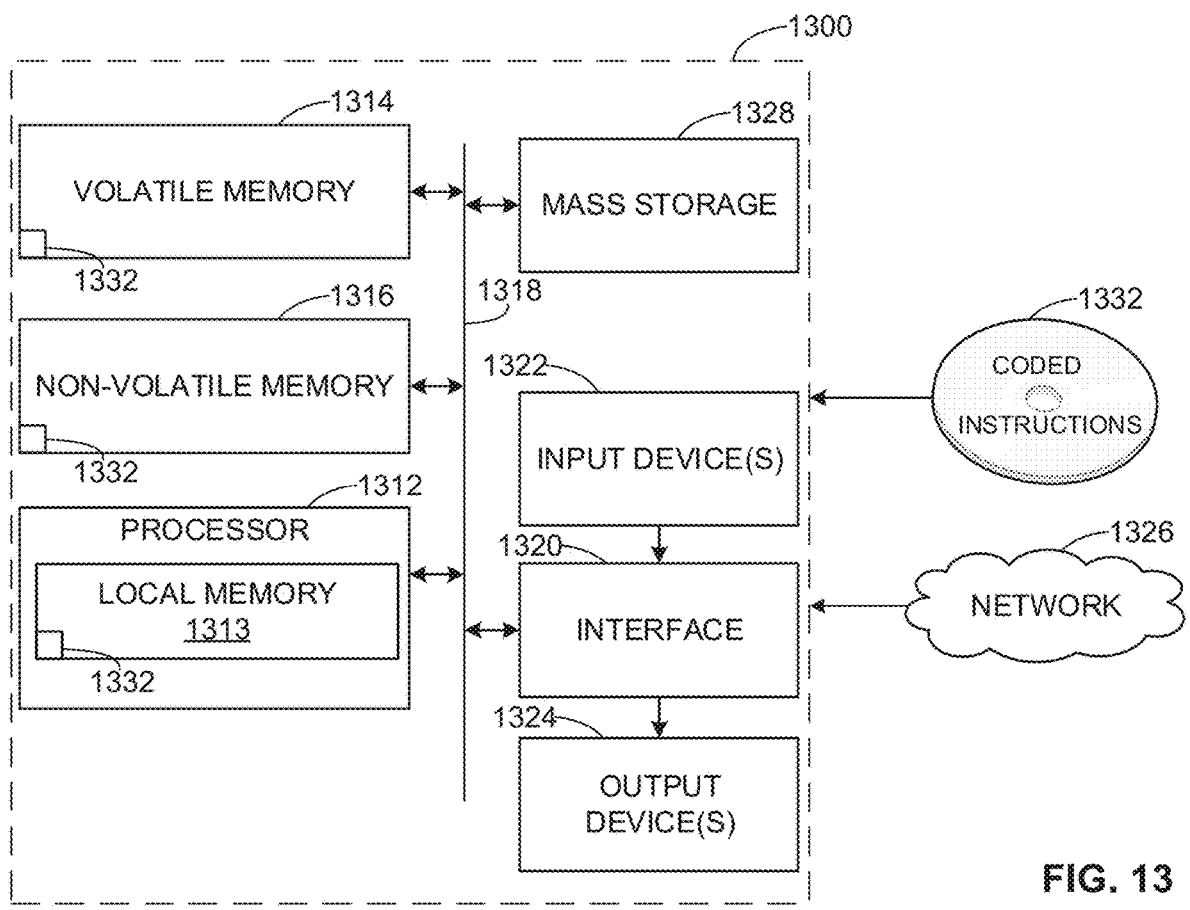
FIG. 13 is a processor platform that may be used to execute the example methods disclosed herein.

FIG. 13 is a block diagram of an example processor platform 1300 capable of executing the instructions of FIGS. 11 and 12 to implement the examples disclosed herein. The processor platform 1300 can be, for example, a semiconductor fabrication device, a wafer/die production controller, a wafer producing/processing device, a die/wafer etching device, a server, a personal computer, a mobile device (e.g., a cell phone, a smart phone, a tablet such as an iPad™), a personal digital assistant (PDA), an Internet appliance, a set top box, or any other type of computing device.

The processor platform 1300 of the illustrated example includes a processor 1312. The processor 1312 of the illustrated example is hardware. For example, the processor 1312 can be implemented by one or more integrated circuits, logic circuits, microprocessors or controllers from any desired family or manufacturer.

The processor 1312 of the illustrated example includes a local memory 1313 (e.g., a cache). The processor 1312 of the illustrated example is in communication with a main memory including a volatile memory 1314 and a non-volatile memory 1316 via a bus 1318. The volatile memory 1314 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1316 may be implemented by flash memory and/or any other desired type of memory device. Access to the main memory 1314, 1316 is controlled by a memory controller.

The processor platform 1300 of the illustrated example also includes an interface circuit 1320. The interface circuit 1320 may be implemented by any type of interface standard, such as an Ethernet interface, a universal serial bus (USB), and/or a PCI express interface.

In the illustrated example, one or more input devices 1322 are connected to the interface circuit 1320. The input device(s) 1322 permit(s) a user to enter data and commands into the processor 1312. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1324 are also connected to the interface circuit 720 of the illustrated example. The output devices 1324 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1320 of the illustrated example, thus, typically includes a graphics driver card, a graphics driver chip or a graphics driver processor.

The interface circuit 1320 of the illustrated example also includes a communication device such as a transmitter, a receiver, a transceiver, a modem and/or network interface card to facilitate exchange of data with external machines (e.g., computing devices of any kind) via a network 1326 (e.g., an Ethernet connection, a digital subscriber line (DSL), a telephone line, coaxial cable, a cellular telephone system, etc.).

The processor platform 1300 of the illustrated example also includes one or more mass storage devices 1328 for storing software and/or data. Examples of such mass storage devices 1328 include floppy disk drives, hard drive disks, compact disk drives, Blu-ray disk drives, RAID systems, and digital versatile disk (DVD) drives.

The coded instructions 1332 of FIGS. 11 and 12 may be stored in the mass storage device 1328, in the volatile memory 1314, in the non-volatile memory 1316, and/or on a removable tangible computer readable storage medium such as a CD or DVD.

Example 1 includes a multilayered die structure including a fin having a first material, the fin epitaxially grown from a first substrate layer having a second material, where a defect portion of the fin is etched or polished, and a second substrate layer having an opening through which the fin extends.

Example 2 includes the subject matter of Example 1, where the fin is annealed.

Example 3 includes the subject matter of any one of Examples 2 or 1, where the opening is back filled with gap material after the fin is selectively etched.

Example 4 includes the subject matter of any one of Examples 1-3, where the opening is polished to define a polished surface of the second substrate layer.

Example 5 includes the subject matter of Example 4, and further includes a semiconductor layer above the polished surface.

Example 6 includes the subject matter of any one of Examples 1-5, and further includes a wire extending through the fin or along on an outer surface the fin.

Example 7 includes a processor including a plurality of transistors, a plurality of substrate layers, and a fin extending through at least one of the plurality of substrate layers, where the fin is epitaxially grown from a substrate layer of the plurality of substrate layers that has a different material from the fin, and where a portion of the fin is etched or polished to reduce epitaxial defects at an interface between the fin and the substrate layer.

Example 8 includes the subject matter of Example 7, and further includes gap fill material between an etched surface of the fin and the substrate layer.

Example 9 includes the subject matter of any one of Examples 7 or 8, and further includes an annealed surface proximate the fin.

Example 10 includes the subject matter of any one of Examples 7-9, and further includes a wire extending through the fin or along an outer surface the fin.

Example 11 includes a method of fabricating a multilayer die structure including removing at least a portion of a substrate semiconductor material to expose a defect region at an interface between the substrate material and a deposited semiconductor material that is different from the substrate semiconductor material. The example method also includes removing the exposed defect region.

Example 12 includes the subject matter of Example 11, where the deposited semiconductor material includes a substrate layer.

Example 13 includes the subject matter of any one of Examples 11 or 12, where the deposited semiconductor material includes a fin that is epitaxially grown from the substrate semiconductor material.

Example 14 includes the subject matter of any one of Examples 11-13, and further includes annealing the die structure.

Example 15 includes the subject matter of any one of Examples 11-14, and further includes back filling an opening defined by etching or polishing the exposed defect region.

Example 16 includes the subject matter of any one of Examples 11-15, where the opening is back filled with non-conductive gap filler material.

Example 17 includes the subject matter of any one of Examples 11-16, where removing the exposed defect regions includes etching the exposed defect region.

Example 18 includes the subject matter of Example 17, where etching the exposed defect occurs via at least one of a selective etching process or a timed chemical etch.

Example 19 includes a method including applying a first semiconductor material to a second semiconductor material that is different from the first semiconductor material to define a defect region therebetween, and removing the exposed defect region.

Example 20 includes the subject matter of Example 19, and further includes including etching or polishing at least one of the first or second semiconductor materials to expose the defect region.

Example 21 includes the subject matter of any one of Examples 19 or 20, where applying the first semiconductor material includes patterning the first semiconductor material onto the second semiconductor material.

Example 22 includes the subject matter of any one of Examples 19-21, where applying the first semiconductor material includes epitaxially growing a fin from the second semiconductor material.

Example 23 includes the subject matter of any one of Examples 19-22, and further includes annealing the die structure.

Example 24 includes the subject matter of any one of Examples 19-23, and further includes back filling an opening that is defined by etching or polishing the defect region.

Example 25 includes the subject matter of any one of Examples 19-24, where removing the defect region includes etching the defect region.

Example 26 includes the subject matter of Example 25, where etching the defect region includes at least one of selective etching or a timed chemical etch.

From the foregoing, it will be appreciated that the above disclosed methods, apparatus and articles of manufacture provide effective removal of defect regions resulting from epitaxial growth that can result in performance degradation and/or negatively impact semiconductor device operation.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. Although the examples disclosed herein have been shown in examples related to semiconductors and/or microprocessors, the examples disclosed herein may be applied to any other appropriate interconnect (e.g., a layered interconnect) application(s) or etching processes in general.

What is claimed is:

1. A method of fabricating a multilayer die structure comprising:
    removing at least a portion of a substrate semiconductor material to expose a defect region at an interface between the substrate semiconductor material and a deposited semiconductor material different from the substrate semiconductor material, wherein the deposited semiconductor material includes a substrate layer; and
    removing the exposed defect region.

2. The method of claim 1, further comprising:
    epitaxially growing a fin from the substrate semiconductor material.

3. The method of claim 1, further comprising:
    annealing the multilayer die structure.

4. The method of claim 1, further comprising:
    back filling an opening defined by said removing the exposed defect region.

5. The method of claim 4, wherein the opening is back filled with non-conductive gap filler material.

6. The method of claim 1, wherein said removing the exposed defect region comprises etching the exposed defect region.

7. The method of claim 6, wherein said etching the exposed defect region occurs via at least one of a selective etching process or a timed chemical etch.

8. The method of claim 1, further comprising:
    applying the deposited semiconductor material onto the substrate semiconductor material.

9. The method of claim 8, wherein said applying the deposited semiconductor material comprises epitaxially growing a fin from the substrate semiconductor material.

10. A multilayered die structure comprising:
    a semiconductor fin, the semiconductor fin within an opening extending through a substrate layer, the semiconductor fin extending through a first end of the opening and above a surface of the substrate layer adjacent the first end of the opening, and the semiconductor fin comprising a trapezoidal fin comprising a ramped surface and a converging tip;
    a dielectric material in contact with the semiconductor fin within the opening of the substrate layer and extending at least to a second end of the opening opposite the first end; and
    a gate over the semiconductor fin.

11. The multilayered die structure of claim 10, wherein a surface of the dielectric material opposite the semiconductor fin is substantially aligned with a second surface of the substrate layer opposite the aforementioned surface of the substrate layer.

12. The multilayered die structure of claim 10, wherein the dielectric material extends through the second end of the opening and over a second surface of the substrate layer opposite the aforementioned surface of the substrate layer to cover at least a portion of the second surface.

13. The multilayered die structure of claim 10, further comprising:
    a wire extending through the semiconductor fin or along an outer surface of the semiconductor fin.

14. The multilayered die structure of claim 10, wherein the semiconductor fin comprises at least one of germanium, tin, indium, gallium, or arsenic.

15. The multilayered die structure of claim 14, further comprising:
    a conductive material within the opening.

16. A multilayered die structure comprising:
    a semiconductor fin, the semiconductor fin within an opening extending through a substrate layer and the semiconductor fin extending through a first end of the opening and above a surface of the substrate layer adjacent the first end of the opening;
    a gap within the opening of the substrate layer and extending at least to a second end of the opening opposite the first end; and
    a gate over the semiconductor fin.

17. The multilayered die structure of claim 16, further comprising:
    a wire extending through the semiconductor fin or along an outer surface of the semiconductor fin.

18. The multilayered die structure of claim 16, wherein the semiconductor fin comprises at least one of germanium, tin, indium, gallium, or arsenic.

19. The multilayered die structure of claim 16, wherein the semiconductor fin comprises a trapezoidal fin comprising a ramped surface and a converging tip.

* * * * *